(12) United States Patent
Piguet

(10) Patent No.: US 6,407,587 B1
(45) Date of Patent: Jun. 18, 2002

(54) ADIABATIC LOGIC CIRCUIT

(75) Inventor: Christian Piguet, Neuchatel (CH)

(73) Assignee: CSEM - Centre Suisse d'Electronique et de Microtechnique S.A., Neuchatel (CH)

( * ) Notice: Subject to any disclaimer, the term of this patent is extended or adjusted under 35 U.S.C. 154(b) by 0 days.

(21) Appl. No.: 09/611,897

(22) Filed: Jul. 7, 2000

(30) Foreign Application Priority Data

Jul. 8, 1999 (FR) .............................. 99 08866

(51) Int. Cl.[7] .............................. H03K 19/094
(52) U.S. Cl. .............................. 326/121; 326/98
(58) Field of Search .............................. 326/21, 93, 95, 326/98, 105, 106, 108, 112, 119, 121

(56) References Cited

U.S. PATENT DOCUMENTS

| | | | | |
|---|---|---|---|---|
| 5,473,270 A | * | 12/1995 | Denker | 326/95 |
| 5,477,164 A | * | 12/1995 | Denker | 326/21 |
| 5,493,240 A | | 2/1996 | Frank | 326/98 |
| 5,506,519 A | * | 4/1996 | Avery et al. | 326/95 |
| 5,521,538 A | | 5/1996 | Dickinson | 326/93 |

OTHER PUBLICATIONS

"Energy Recovery Circuits Using Reversible and Partially Reversible Logic", Ye Y et al., IEEE Transactions on Circuits and Systems I: Fundamental Theory and Applications, IEEE, Inc. New York, vol. 43, No. 9, (Sep. 1, 1966), pp. 769–778.

"Reversible Energy Recovery Logic Circuit Without Non–Adiabatic Energy Loss", Lim J. et al., Electronics Letters, vol. 34, No. 4, (Feb. 19, 1998), pp. 344–346.

* cited by examiner

Primary Examiner—Tuan T. Lam

(57) ABSTRACT

An adiabatic logic circuit includes bidirectional transfer members to which input variables of the circuit are applied and which are connected between a first circuit terminal connected to a clock generator whose clock signal also powers the circuit and a second circuit terminal forming its output and which assumes two logic levels as a function of the input variables. The circuit has a third terminal connected to the second terminal via its inherent capacitance and precharges the second terminal to a potential corresponding to one of the logic levels outside active phases of the clock signal.

11 Claims, 5 Drawing Sheets

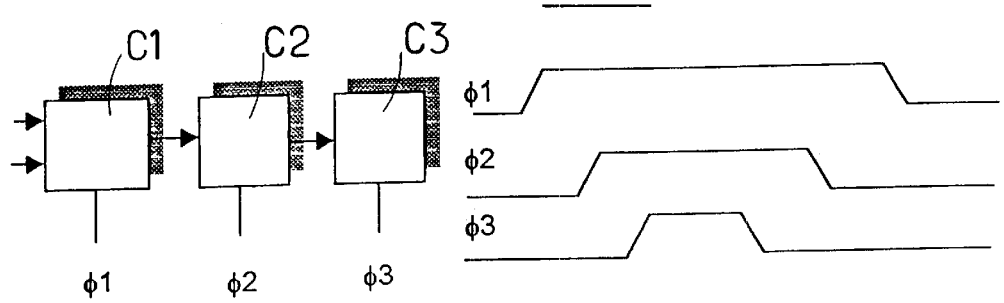
FIG.: 1
PRIOR ART
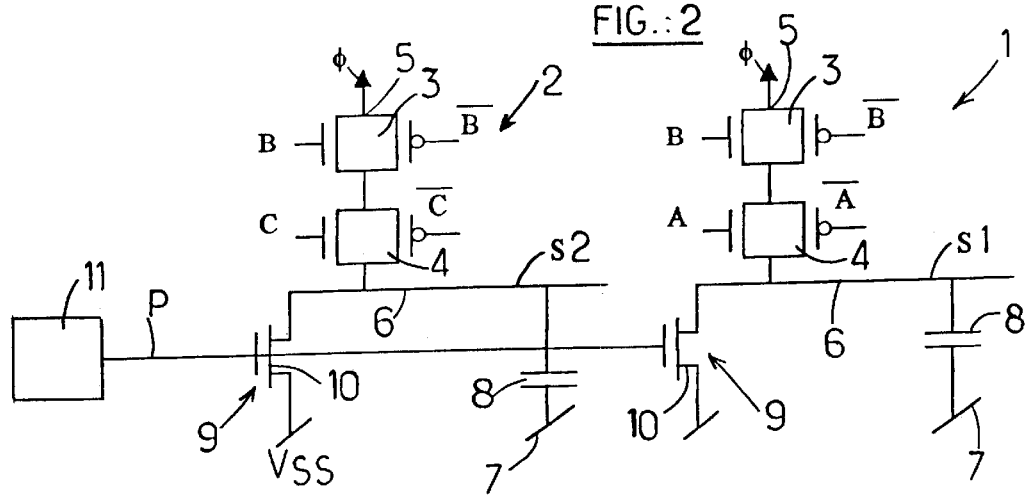
FIG.: 2

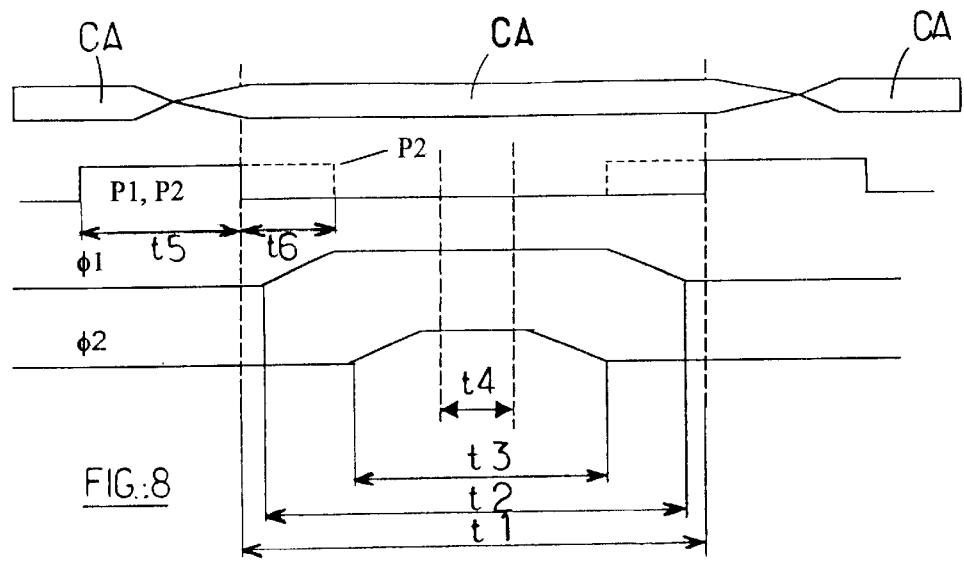
FIG.:8
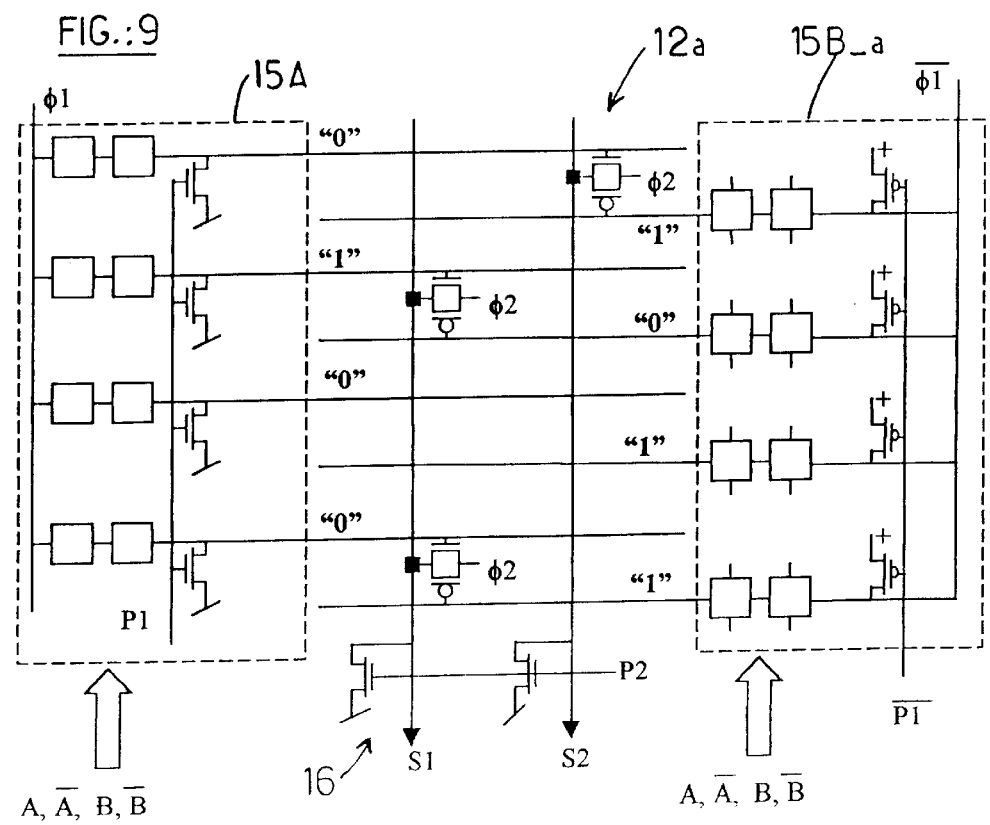
FIG.:9

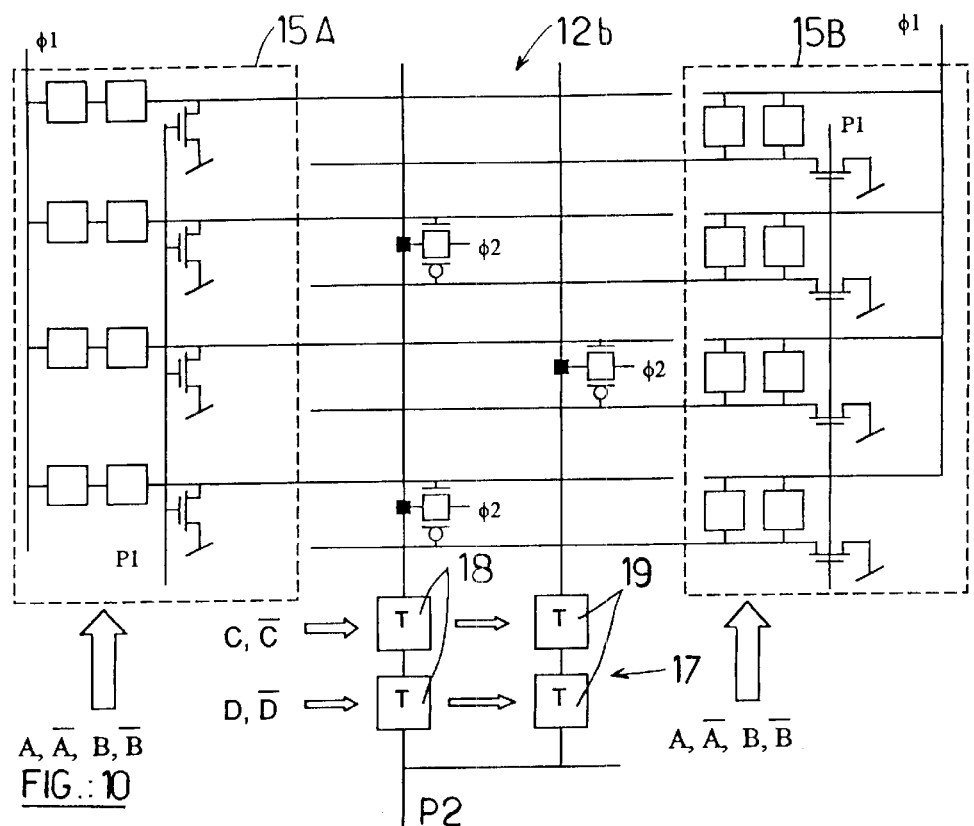
FIG.: 10
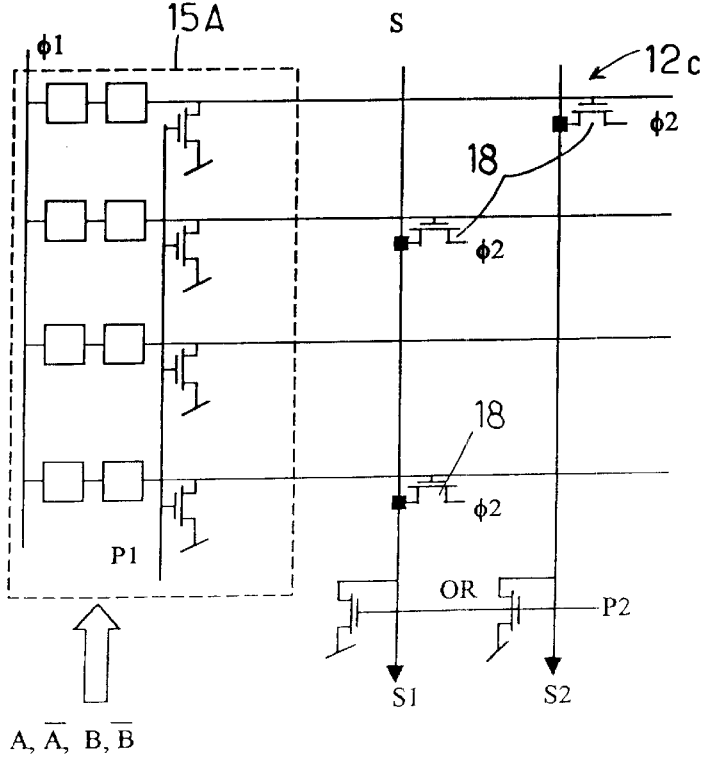
FIG.: 11

ADIABATIC LOGIC CIRCUIT

BACKGROUND OF THE INVENTION

1. Field of the Invention

The present invention relates to adiabatic logic circuits.

2. Description of the Prior Art

Adiabatic logic circuits are described in particular in chapter 6 of a work by C. Piguet, whose title is "Circuits complexes—Evolution de la technologie VLSI", derived from courses on complex circuits given at the Ecole Polytechnique Fédérale de Lausanne, Switzerland, 1998, and in an article by L. J. Svensson et al. entitled "Driving a capacitive load without dissipating $fCV^2$", IEEE Symposium on Lower Power Electronics, pp. 100 and 101, 1994.

The above circuits have the advantage of reducing consumption in accordance with the equation:

$$E = \frac{\tau}{T} CV_{dd}^2$$

in which $\tau$ is a delay internal to the circuit, C is the internal capacitance, T is the rise time of the clock signal, which also provides the power supply, and $V_{dd}$ is the potential of one of the logic levels that the input and output variables of the circuit can take.

For an adiabatic logic circuit to operate the input variables which are applied to it must reach their stable logic level before the clock signal changes state. This is a difficult problem if several adiabatic logic circuits are connected in cascade, the output of one circuit then constituting one of the input variables of a subsequent gate. The clock signal of a second circuit must then not change state before the output signal of the preceding circuit has stabilized. It is therefore necessary to use interleaved clock signals from what is usually referred to as a "retractile cascade clock". Because the input signals are generally in the true form and in the complemented form, and must be valid before the clock signal rises, the adiabatic circuit must be able to deliver its output signal both in the true form and in the complemented form.

FIG. 1 of the accompanying drawings illustrates this concept. The adiabatic logic circuits C1, C2 and C3 in the figure are connected in cascade and their respective clocks $\phi1$, $\phi2$ and $\phi3$ are retractile clocks, as shown by the signals represented in FIG. 1.

A clock generator able to generate this type of clock signal is complex and difficult to design, especially if the "logic depth" is great, i.e. if many logic circuits are connected in cascade.

However, some circuits include only two logic gates in series, such as programmable logic arrays (PLA) and read-only memories (ROM); this corresponds to a "logic depth" equal to 2 and therefore requires only two clock signals.

The object of the invention is to provide an adiabatic logic circuit which uses a precharging mechanism to reduce the number of transistors needed.

SUMMARY OF THE INVENTION

The invention therefore provides an adiabatic logic circuit including bidirectional transfer members to which input variables of the circuit are applied and which are connected between a first circuit terminal adapted to be connected to a clock generator whose clock signal also powers the circuit and a second circuit terminal forming its output and adapted to assume two logic levels as a function of the input variables, the circuit also including a third terminal connected to the second terminal via the inherent capacitance thereof and means for precharging the second terminal to a potential corresponding to one of the logic levels outside active phases of the clock signal.

According to other features of the invention:

the precharging means include a transistor whose source-drain path is connected between the second terminal and the potential of one of the logic levels and the transistor is connected to a precharging signal generator, the transistor is an n-channel transistor and the logic level is the potential $V_{ss}$ of the circuit, the transistor is a p-channel transistor and the logic level is the potential $V_{dd}$ of the circuit, the bidirectional transfer members are connected in series, the bidirectional transfer members are connected in parallel.

The invention also provides an addressable memory circuit including a matrix of rows and columns and at least one address decoder connected to the rows and including a plurality of adiabatic logic circuits as defined above to which address variables for the memory circuit are applied and wherein the precharging means of the adiabatic logic circuits of the decoder are adapted to receive the same precharging signal.

According to other features of the invention:

the memory circuit includes first and second address decoders whose adiabatic logic circuits are respectively connected to the rows to supply them both the true value of each address and the complement of each address value, the precharging means of the logic circuits of the decoders are adapted to precharge the second terminal of the logic circuit of which they are part to the potential of the same logic level, the precharging means of the logic circuit of one of the decoders are adapted to precharge the second terminals thereof to a logic level different than that to which the second terminals of the logic circuits of the other decoder are precharged, the memory circuit further includes an output network connected to the columns and including a plurality of adiabatic logic circuits as defined above and wherein the precharging means of the logic circuits of the output network are adapted to receive the same precharging signal as the precharging means of the logic circuits of at least one decoder, or possibly the precharging signal extended, the output network includes a logic circuit for each of the columns and the transfer members of the circuits are at crossings of the rows and the columns of the matrix at which a logic "1" must be present, and the output network forms a multiplexer.

Other features and advantages of the invention will become apparent in the course of the following description, which is given by way of example only and with reference to the accompanying drawings.

BRIEF DESCRIPTION OF THE DRAWINGS

FIG. 1, already described, shows a cascade of prior art adiabatic circuits.

FIGS. 2, 3 and 4 each show one embodiment of a pair of adiabatic logic circuits according to the invention, each with a different logic function.

FIG. 8 is a timing diagram showing the control signals of the memory circuit shown in FIG. 7.

FIGS. 9 to 11 show three other embodiments of the invention.

DETAILED DESCRIPTION OF THE PREFERRED EMBODIMENTS

Figure 3:
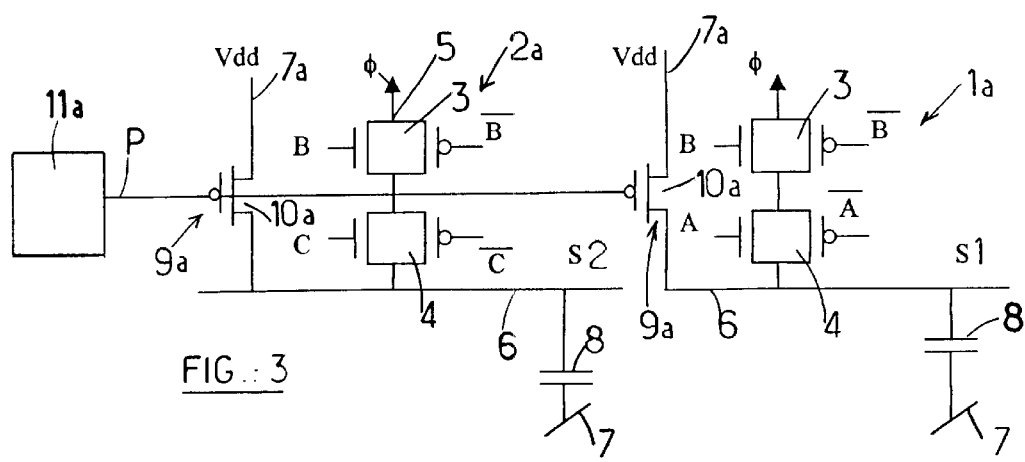

The first embodiment of an adiabatic logic circuit, shown in FIG. 2, has two AND gates 1 and 2 connected in parallel and each forming an adiabatic circuit according to the invention.

Each AND gate comprises two bidirectional transfer members 3 and 4, here taking the form of two n-type transistors connected in series and shunted by two p-type transistors connected in series. The input variables A, B and C and their complemented values $\overline{A}$, $\overline{B}$ and $\overline{C}$ are applied to the gates of respective transistors of these transfer members, as shown in FIG. 2. The transfer members are connected in series (AND function) between a first terminal 5 of the circuit to which a clock signal is applied and a second terminal 6 of the circuit from which the output variable S1 or S2 of the gate in question can be taken.

The second terminal 6 is connected to a third circuit terminal 7 by its inherent capacitance, which is represented as a capacitor 8. The third terminal is at the potential of one of the logic levels that the output terminal can take, depending on the input variables. In the example shown that potential is the ground potential $V_{ss}$.

According to the invention, each AND gate 1 and 2 also includes precharging means 9 which in the present example take the form of a transistor 10 connected by its source-drain path between the second and third terminals of the circuit. The gates of the precharging transistors 10 are connected to a fourth circuit terminal common to the two AND gates 1 and 2 and to which a precharging signal generator 11 can be connected. If the circuit includes a greater number of gates connected in parallel, each precharging transistor can receive the same precharging signal P.

In the example shown, the second terminal of each AND gate is precharged to "0".

The adiabatic circuit operates in the following manner.

If the terminal 5 is at "0" ($\phi$="0"), precharging is active ("0") and S1=0 and S2=0. The input variables A, B and C and the complemented variables $\overline{A}$, $\overline{B}$ and $\overline{C}$ are assumed to have acquired a stable logic level. The precharge P is released, but S1 and S2 remain at "0".

The signal $\phi$ from a clock generator (not shown) then rises slowly from "0" to "1". Depending on the values of the input variables, the signal S1 and S2 remain dynamically at "0" or track the clock signal $\phi$ (the transfer members 3 and 4 are conducting at this time).

The values of the outputs S1 and S2 can then be exploited. The signal $\phi$ then falls slowly from "1" to "0". The charge previously accumulated in the capacitor 8 is recovered in the clock generator via the transfer members 3 and 4. The signal $\phi$ is then at "0" again and precharging is activated to set S1 and S2 to "0" again.

FIG. 3 shows a second embodiment in which the adiabatic circuits according to the invention each form a NAND gate.

Compared to the FIG. 2 embodiment, similar elements are designated by the same references and different elements have references with the suffix "a".

In this example precharging means 9a are provided in the form of a p-channel transistor connected between the second terminal 6 of the respective gate and a third terminal 7a at the potential $V_{dd}$, i.e. the logic potential opposite that at the terminal 7 in the FIG. 2 embodiment. As the outputs of the gates 1a and 2a are at "1" in this case, the clock signal $\phi$ is at "1" when the clock generator is in the rest state.

The adiabatic circuits in FIG. 3 are NAND gates because, when the transfer members 3 and 4 are conducting, the output S1 or S2 tracks the signal $\phi$ when it changes from "1" to "0", assuming that A=B=1. Thus S1 or S2=0 for A=B=1.

Operation is as follows.

If the terminal 5 is at "1" ($\phi$="1"), precharging is active ("1") and so S1=1 and S2=1. The precharging P is released when the input variables A, B and C have acquired a stable logic level but S1 and S2 remain at "1".

The signal $\phi$ from the clock generator then falls slowly from "1" to "0". Depending on the values of the input variables, the signals S1 and S2 remain dynamically at "1" or track the clock signal $\phi$ (the transfer members are conducting at this time). The charge in the capacitor 8 is recovered in the clock generator via the transfer members.

The values of the outputs S1 and S2 can then be exploited. The signal $\phi$ then rises slowly from "0" to "1". The signal $\phi$ is again at "1" and precharging is activated to set S1 and S2 to "1" again.

Figure 4:
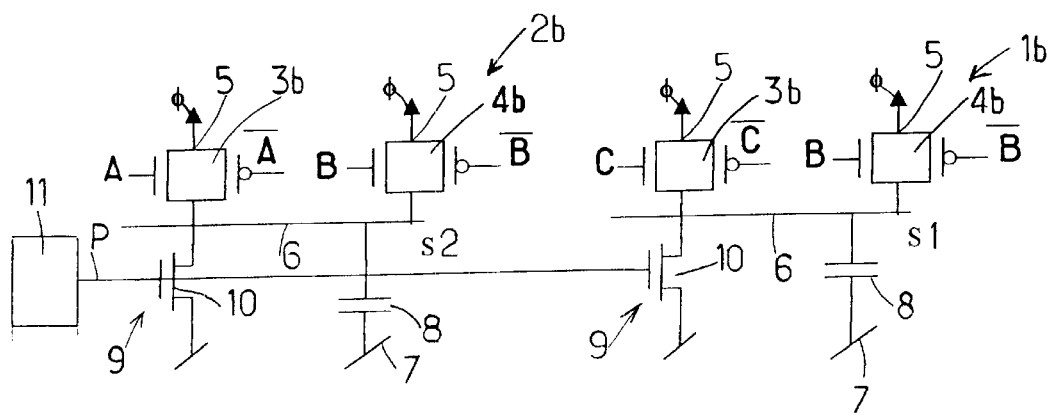

FIG. 4 shows a third embodiment of an adiabatic circuit according to the invention in which each circuit 1b, 2b forms an OR gate. Here the precharging means 9 are analogous to those shown in FIG. 2. To provide the OR function, the transfer members 3b and 4b are connected in parallel between the first and second terminals 5 and 6 of the circuit.

Note that the logic circuits of the adiabatic circuits just described can be determined by choosing the precharging level (n-channel or p-channel transistor) and/or series or parallel connection of the transfer members. Thus a NAND gate can be formed by providing precharging with an n-channel transistor and by connecting the transfer members in parallel.

Several applications of the adiabatic circuits just described will now be considered.

Figure 5:
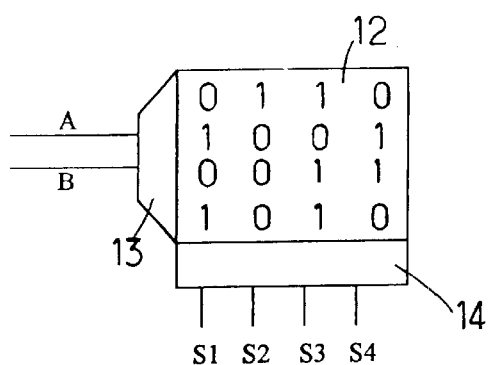
FIG. 5 is a truth table for a memory circuit which can incorporate adiabatic logic gates according to the invention.

FIG. 5 is a simplified representation of a read-only memory (ROM) 12 including an input decoder 13 for decoding input variables (addresses) A and B and an output network 14 for output signals S1 to S4. This is a highly simplified example, of course, and a ROM can have a much greater capacity. FIG. 5 is one example of a truth table for the memory.

Figure 6:
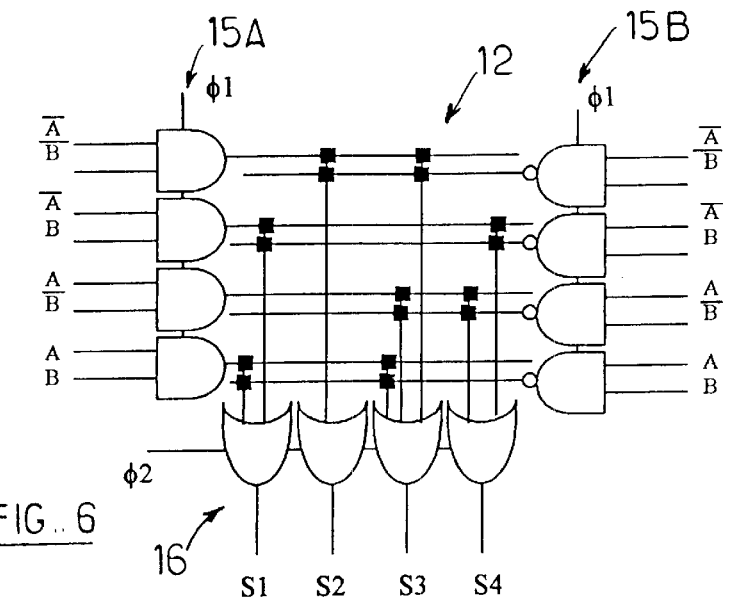
FIG. 6 is a basic schematic of a memory circuit of the above kind.

FIG. 6 is a schematic of the ROM 12 using adiabatic circuits as shown in FIGS. 2 to 4.

The memory 12 includes first and second decoders 15A and 15B, each of which has as many logic gates as there are memory rows, and an output network 16.

The first decoder 15A is made up of AND gates as shown in FIG. 2, the second decoder 15B is made up of NAND gates having a precharge connected to the potential $V_{ss}$ and transfer members in parallel, and the output network 16 is made up of OR gates as shown in FIG. 4.

As can be seen in FIG. 4, the OR gates, such as the gates 1b and 2b, require true and complemented input variables to operate. If a completely adiabatic ROM is required, it is necessary to generate on each row of the matrix not only true signals but also their complements. In a memory configuration of the kind considered here it is very difficult or even impossible to produce these signals using inverters, whether adiabatic or not. This explains the presence of the two networks for-decoding the address variables of the memory.

Figure 7:
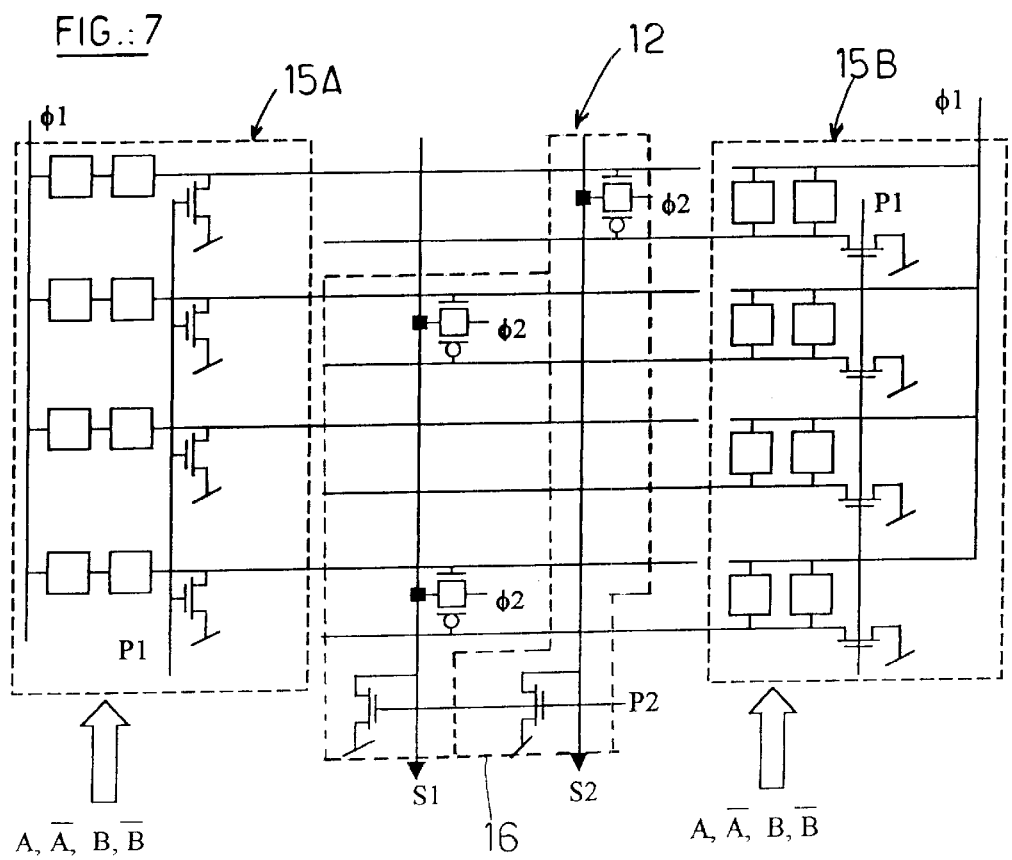
FIG. 7 shows a first embodiment of an adiabatic memory circuit according to the invention.

FIG. 7 is a more detailed representation of the ROM 12 shown in FIG. 6, simplified by omitting the outputs S3 and S4 and the corresponding column conductors.

It can be seen that the gates of the decoders 15A and 15B are, controlled by a clock signal φ1 and precharged to $V_{ss}$ by the precharge signal P1 and that they respectively constitute AND gates as shown in FIG. 2 and NAND gates conforming to a variant, previously described, of FIG. 3, all the gates receiving the variables A and B and their complements.

The OR gates 16 supplying the outputs S1 and S2 conform to FIG. 4. Their transfer members are distributed in the matrix of rows and columns of the memory according to its truth table (see FIG. 5). The OR gates are precharged to $V_{ss}$ by a signal P2.

FIG. 8 shows the waveform of the signals applied to the memory shown in FIG. 7 during one cycle of operation. The address field CA is maintained active during a time period t1. The decoders 15A and 15B and the output network 16 are controlled by retractile clock signals φ1 and φ2 having different active time periods t2 and t3, with t3<t2. The decoders 15A and 15B must remain active during the time period t2 for the OR gates 16 to receive their input signals. The output signals of the OR gates are therefore valid during the time period t4. The precharging signals P1 and P2 can be identical and of duration t5 on changing towards their inactive level at the start of the address field CA. However, the duration of the precharging signal P2 can be extended by the time period t6, as long as the signal φ2 remains at "0".

FIG. 9 shows a variant ROM 12a in which the NAND gates of the decoder 15B shown in FIG. 7 are replaced by NAND gates precharged to $V_{dd}$ of a decoder 15B-a. This implies supplying these gates with a clock signal $\overline{\phi 1}$ which is the complement of φ1. The advantage of this version is that, during a working cycle of the memory, only the gates of the decoder 15A which have to go to "1" change state, by tracking φ1, whereas for the decoder 15B-a only the NAND gate which has to go to "0" changes state, by tracking $\overline{\phi 1}$. In this version, the activity of the gates of the decoders can therefore be minimized.

FIG. 10 shows a variant of the ROM shown in FIG. 7 in which the output OR gates form an output multiplexer 17. In. this case, the OR gates include transfer members 18 and 19 controlled by variables C and D and their respective complements. The multiplexer is precharged with a precharging signal P2.

The variants shown in FIGS. 7 and 10 must include means for generating from the input variables (A, B, respectively A, B, C and D) the complements of those variables. The generator means do not need to be adiabatic. If they are adiabatic, three retractile clock signals (like the signals shown in FIG. 1) are needed.

FIG. 11 shows another variant ROM which is of the semi-adiabatic type and in which the transmission gates of the output OR gates are replaced with n-channel transistors 18. The decoder 15B with NAND gates can then be omitted. Thus the total number of transistors used can be considerably reduced. The source-drain path of the transistors 18 is powered by the signal φ2. However, this circuit arrangement has a reduced maximum output voltage equal to $V_{dd}-V_t$, where $V_t$ is the threshold voltage of the transistors 18. The output must then be connected to particular components, for example inverters with an asymmetric threshold.

What is claimed is:

1. An adiabatic logic circuit including bidirectional transfer members to which input variables of said circuit are applied, and first and second circuit terminals and a clock generator, said transfer members being connected between said first and second circuit terminals, said first circuit terminal being connected to said clock generator whose clock signal also powers said circuit, said second circuit terminal forming an output of said circuit and being capable of assuming either of two logic levels as a function of said input variables, said circuit also including a third terminal coupled to said second terminal via the inherent capacitance thereof, wherein means are provided for precharging said second terminal to a potential corresponding to one of said logic levels outside active phases of said clock signal.

2. The adiabatic logic circuit according to claim 1 wherein said precharging means include a transistor whose source-drain path is connected between said second terminal and the potential of one of said logic levels and said transistor is connected to a precharging-signal generator.

3. The adiabatic logic circuit according to claim 2 wherein said transistor is an n-channel transistor and said logic level is the potential $V_{ss}$ of said circuit.

4. The adiabatic logic circuit according to claim 2 wherein said transistor is a p-channel transistor and said logic level is the potential $V_{dd}$ of said-circuit.

5. An addressable memory circuit including a matrix of rows and columns and at least one address decoder connected to said rows, and including a plurality of adiabatic logic circuits to which address variables for said memory circuit are applied, each of said adiabatic logic circuits including bidirectional transfer members to which input variables of said logic circuit are applied, and first and second circuit terminals and a clock generator, said transfer members being connected between said first and second circuit terminals, said first circuit terminal being connected to said clock generator whose clock signal also powers said logic circuit, said second circuit terminal forming an output of said logic circuit and being capable of assuming either of two logic levels as a function of said input variables, said logic circuit also including a third terminal coupled to said second terminal via the inherent capacitance thereof, wherein means are provided for precharging said second terminal to a potential corresponding to one of said logic levels outside active phases of said clock signal, and wherein said precharging means of said adiabatic logic circuits of said decoder receive the same precharging signal.

6. The memory circuit according to claim 5 including first and second address decoders whose adiabatic logic circuits are respectively connected to said rows to supply them both the true value of each address and the complement of each address.

7. The memory circuit according to claim 6 wherein said precharging means of said logic circuits of said decoders precharge said second terminal of said logic circuit of which said precharging means are part to the potential of the same logic level.

8. The memory circuit according to claim 5 wherein said precharging means of said logic circuits of one of said decoders precharge the second terminals thereof to a logic level different than that to which said second terminals of said logic circuits of the other decoder are precharged.

9. The memory circuit according to claim 5 further including an output network connected to said columns and including a plurality of adiabatic logic circuits each of said adiabatic logic circuits of said output network including bidirectional transfer members to which input variables of said logic circuit of said output network are applied, and first and second circuit terminals and a clock generator, said transfer members being connected between said first and second circuit terminals, said first circuit terminal being connected to said clock generator whose clock signal also powers said logic circuit of said output network, said second circuit terminal forming an output of said logic circuit of said output network and being capable of assuming either of two logic levels as a function of said input variables, said logic circuit of said output network also including a third terminal coupled to said second terminal via the inherent capacitance thereof, wherein means are provided for precharging said second terminal to a potential corresponding to one of said logic levels outside active phases of said clock signal, and wherein said precharging means of said logic circuits of said output network receive the same precharging signal as said precharging means of said logic circuits of at least one decoder, or said precharging signal extended.

10. The memory circuit according to claim 9 wherein said output network includes a logic circuit for each of said columns and said transfer members of said circuits are at crossings of said rows and said columns of said matrix at which a logic "1" must be present.

11. The memory circuit according to claim 9 wherein said output network forms a multiplexer.

* * * * *